(12) United States Patent
Wang et al.

(10) Patent No.: US 7,180,376 B2
(45) Date of Patent: Feb. 20, 2007

(54) SYNTHESIZER AND CALIBRATING METHOD FOR THE SAME

(75) Inventors: Chong-Ren Wang, Chiayi (TW); Chao-Shi Chuang, Shinying (TW); Chung-Cheng Wang, Xizhi (TW)

(73) Assignee: Airoha Technology Corp., Hsinchu (TW)

( * ) Notice: Subject to any disclaimer, the term of this patent is extended or adjusted under 35 U.S.C. 154(b) by 151 days.

(21) Appl. No.: 11/034,484

(22) Filed: Jan. 13, 2005

(65) Prior Publication Data

US 2005/0156676 A1 Jul. 21, 2005

(30) Foreign Application Priority Data

Jan. 19, 2004 (TW) .............................. 93101340 A

(51) Int. Cl.
*H03L 7/00* (2006.01)

(52) U.S. Cl. ........................ 331/16; 331/179; 331/175

(58) Field of Classification Search .................. 331/16, 331/179, 175; 327/156; 375/376
See application file for complete search history.

(56) References Cited

U.S. PATENT DOCUMENTS

| | | | |
|---|---|---|---|
| 4,864,257 A | 9/1989 | Vandegraaf | 332/125 |
| 4,965,531 A | 10/1990 | Riley | 331/1 A |
| 6,008,703 A | 12/1999 | Perrott et al. | 332/100 |
| 6,515,553 B1 | 2/2003 | Filiol et al. | 332/127 |
| 7,005,928 B2 * | 2/2006 | Albasini et al. | 331/16 |
| 7,015,738 B1 * | 3/2006 | Cao | 327/159 |

* cited by examiner

Primary Examiner—Arnold Kinkead
(74) Attorney, Agent, or Firm—Thomas, Kayden, Horstemeyer & Risley

(57) ABSTRACT

Synthesizer and calibrating method utilizing same. The frequency synthesizer modulates input signals comprising a phase locked loop circuit. The phase locked loop circuit comprises a phase frequency detector for generating a first signal, a low pass filter for outputting a filtered control signal derived from the received first signal, a voltage control oscillator for generating an output signal with a first frequency based on the control signal, a frequency divider dividing the first frequency for output to the input terminal of the phase frequency detector, a modulator coupled to the frequency divider, a pre-emphasis filter receiving and filtering the input signal for output to the modulator, and an auto loop gain calibration circuit, receiving the control signal, and calculating a current gain of the control signal in accordance with the voltage of the control signal to compensate for the frequency response mismatch between the pre-emphasis filter and the frequency synthesizer.

12 Claims, 11 Drawing Sheets

SYNTHESIZER AND CALIBRATING METHOD FOR THE SAME

BACKGROUND OF THE INVENTION

1. Field of the Invention

The present invention relates to a frequency synthesizer, and more particularly, to a frequency synthesizer with auto loop gain calibration.

2. Description of the Related Art

In current wireless transceivers, a phase locked loop circuit generates carrier signals. The phase locked loop circuit comprises a phase frequency detector, a low pass filter, a voltage control oscillator, and a frequency divider. A reference clock signal and a divided signal output from the divider are applied to the phase frequency detector for outputting an error signal. After filtering by the low pass filter, the output signal is input into the voltage control oscillator for generating a corresponding frequency which is then transmitted as feedback to the frequency divider. Thus the output carrier signal from the phase locked loop circuit occupies a determined frequency.

The output carrier signal is then modulated by a modulator to generate a modulated signal. A conventional method modulates the oscillator directly. When a wanted carrier frequency is locked by the phase locked loop circuit. A feedback path in the phase locked loop circuit is cut off, and the oscillator is modulated directly. The problem here is that the feedback path must be linked back periodically to prevent over frequency shift. The oscillator must additionally be isolated from surrounding noise to prevent interruptions.

In U.S. Pat. No. 4,965,531; Relay ,et al. describes a modulating method. In U.S. Pat. No. 4,864,257; Vandergraaf ,et al describes another modulating method. Though the carrier frequency of the mentioned two patents do not cause frequency shifts due to the close loop of the synthesizers, the bandwidth, however is limited. Due to filtering of the high frequency, a distorted frequency is filtered so a frequency is generated, resulting in limited signal.

In U.S. Pat. No. 4,864,257; Vandergraaf ,et al. describes a circuit to compensate for the limited frequency band. The circuit applies an inverse frequency to compensate for the limited frequency of the phase locked loop circuit. Process and the temperature issues, however, affect the mismatch between the compensated frequency and the limited frequency. Therefore, in U.S. Pat. No. 6,008,703; a digital pre-emphasis filter is employed to lessen the effects of process and temperature. If the channel and the bandwidth increase, however, the number of oscillators and the operational range also increase. Thus, frequency mismatching situation still occurs. In U.S. Pat. No. 6,515,553; Norman ,et al. describes a dual-port modulation, employing a high-pass filter for passing the high frequency portion of a signal and adding the high frequency portion of the signal to a control circuit of an oscillator of a phase locked loop circuit. Thus a full-pass filter can be achieved. Process and the temperature issues still exist, however, and the circuit area of the analog circuit is greater than a digital circuit. Thus increasing costs, integrality and reducing efficiency.

FIG. 1 shows a conventional frequency synthesizer comprising a pre-emphasis filter 15. The phase locked loop circuit 1 comprises a phase detector 10, a low pass filter 11, a voltage control oscillator 12, an N/N+1 frequency divider 13 and a Σ–Δ modulator 14. The phase locked loop circuit 1 comprises low pass filter 11 for filtering the high frequency portion of the transmitted signal. A pre-emphasis filter 15 is installed for overcoming the low pass filter which filters the high frequency portion of the transmitted signal. The frequency response of the pre-emphasis filter 15 is the inverse of the closed loop frequency response of the synthesizer as shown in FIG. 2A. A flat frequency response is generated by the two frequency responses.

A synthesizer, however, operates on a wild frequency band, and different frequency bands of various voltage control oscillators are installed in a synthesizer. Due to the limited size of a circuit area, however, only one pre-emphasis filter is employed, and gain mismatch occurs. Thus the frequency response is different, resulting in signal distortion. As shown in FIG. 2B and FIG. 2C, in FIG. 2B, bandwidth of the pre-emphasis filter 15 is narrower than the phase locked loop circuit 1 ($f_c$–pre<$f_c$–p11). In FIG. 2C, bandwidth of pre-filter 15 is wilder than the phase locked loop circuit 1 ($f_c$–pre>$f_c$–p11). The frequency mismatch occurs according to the pre-emphasis filter 15 and the phase locked looped circuit 1, resulting in transmitted signal distortion ($f_c$–pre<$f_c$–p11).

SUMMARY OF THE INVENTION

Accordingly, an object of the present invention is to provide a synthesizer and an auto calibrating method for same.

In order to achieve this and other objects of the invention, a frequency synthesizer is provided. The frequency synthesizer of the invention is employed to modulate an input signal which comprises a phase locked loop circuit. The phase locked loop circuit comprises a phase frequency detector for generating a first signal, a low pass filter for outputting a filtered control signal derived from the received first signal, a voltage control oscillator for generating an output signal with a first frequency based on the control signal, a frequency divider dividing the first frequency for output to the input terminal of the phase frequency detector, a modulator coupled to the frequency divider, a pre-emphasis filter receiving and filtering the input signal for output to the modulator, and an auto loop gain calibration circuit, receiving the control signal, and calculating a current gain of the control signal in accordance with the voltage of the control signal to compensate for the frequency response mismatch between the pre-emphasis filter and the frequency synthesizer.

The invention additionally provides a method, for auto calibrating a gain of a phase locked loop circuit of a frequency synthesizer, wherein the frequency synthesizer comprises a pre-emphasis filter and a low-pass filter. The frequency response of the phase locked loop circuit is inverse to the frequency response of the pre-emphasis filter. The method comprises the steps of: generating a control signal output from a digital controller to the frequency synthesizer. The auto loop calibration circuit then calculates a corresponding current gain according to the voltage of the control signal. Finally, a current corresponding to the current gain of the phase frequency is output, for matching frequency response of the pre-emphasis filter with the frequency synthesizer.

A detailed description is given in the following with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1:
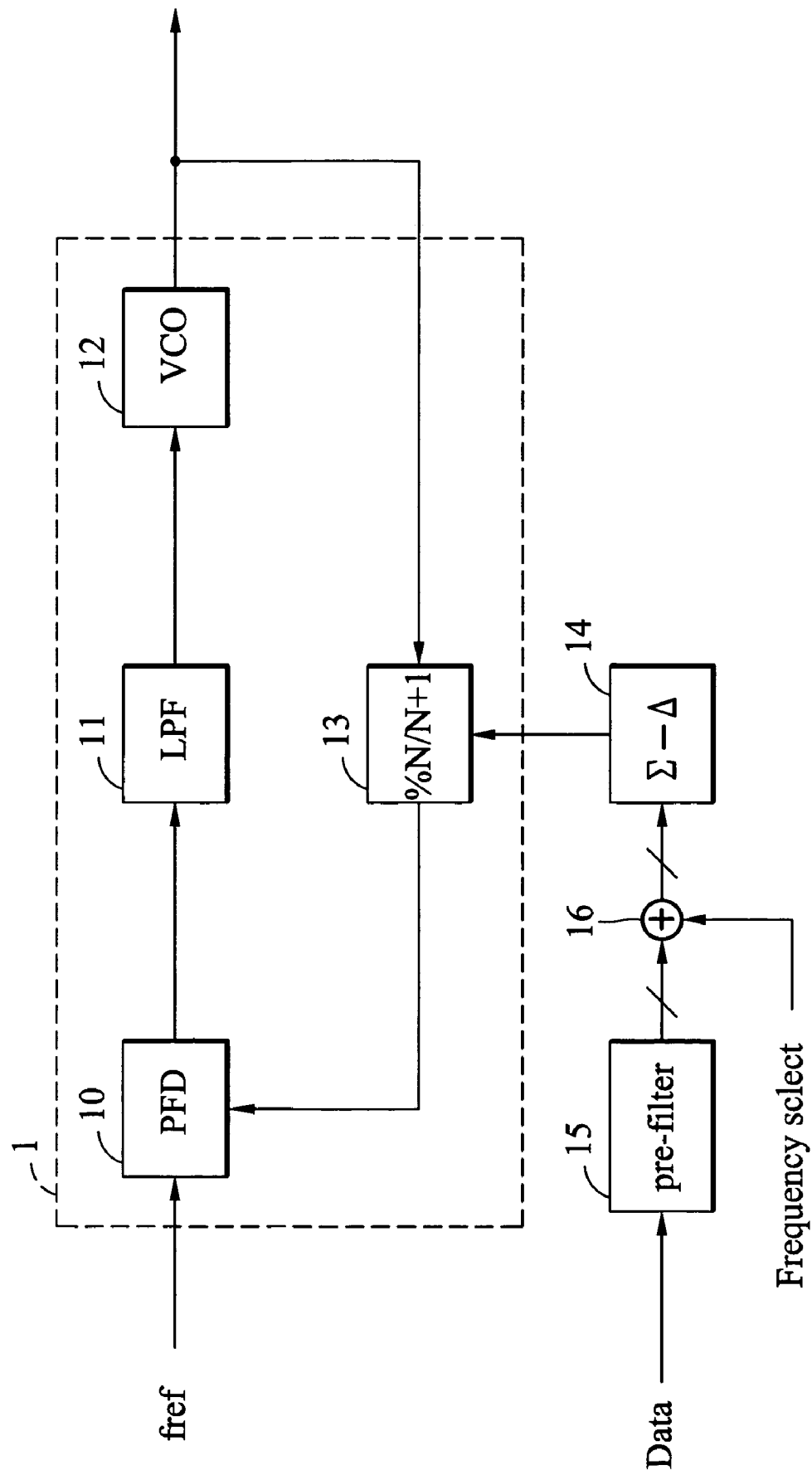
FIG. 1 shows a conventional synthesizer with a pre-emphasis filter.
Figure 2A:
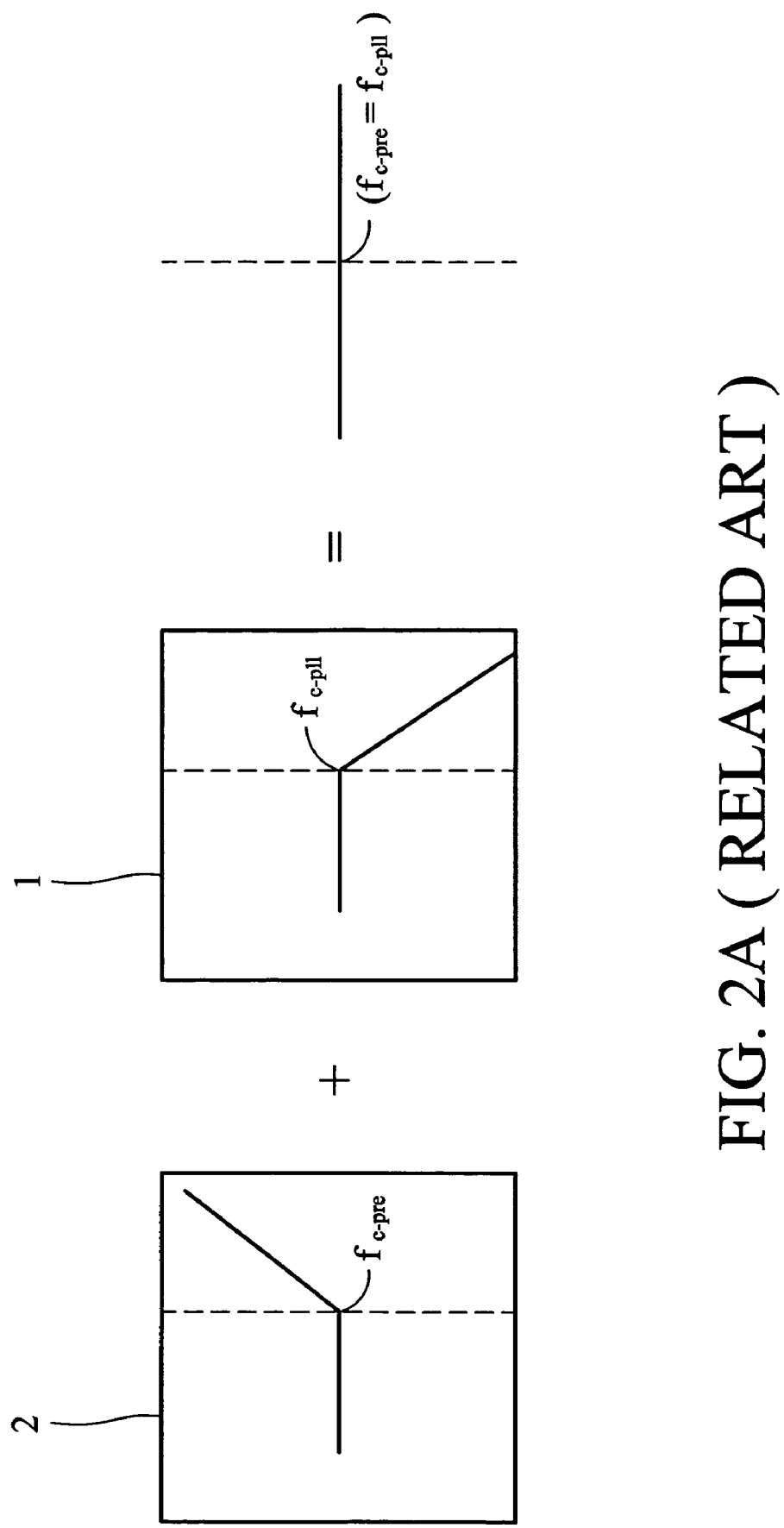
FIG. 2A shows a bandwidth of a pre-emphasis filter equal to the bandwidth of a synthesizer.
Figure 2B:
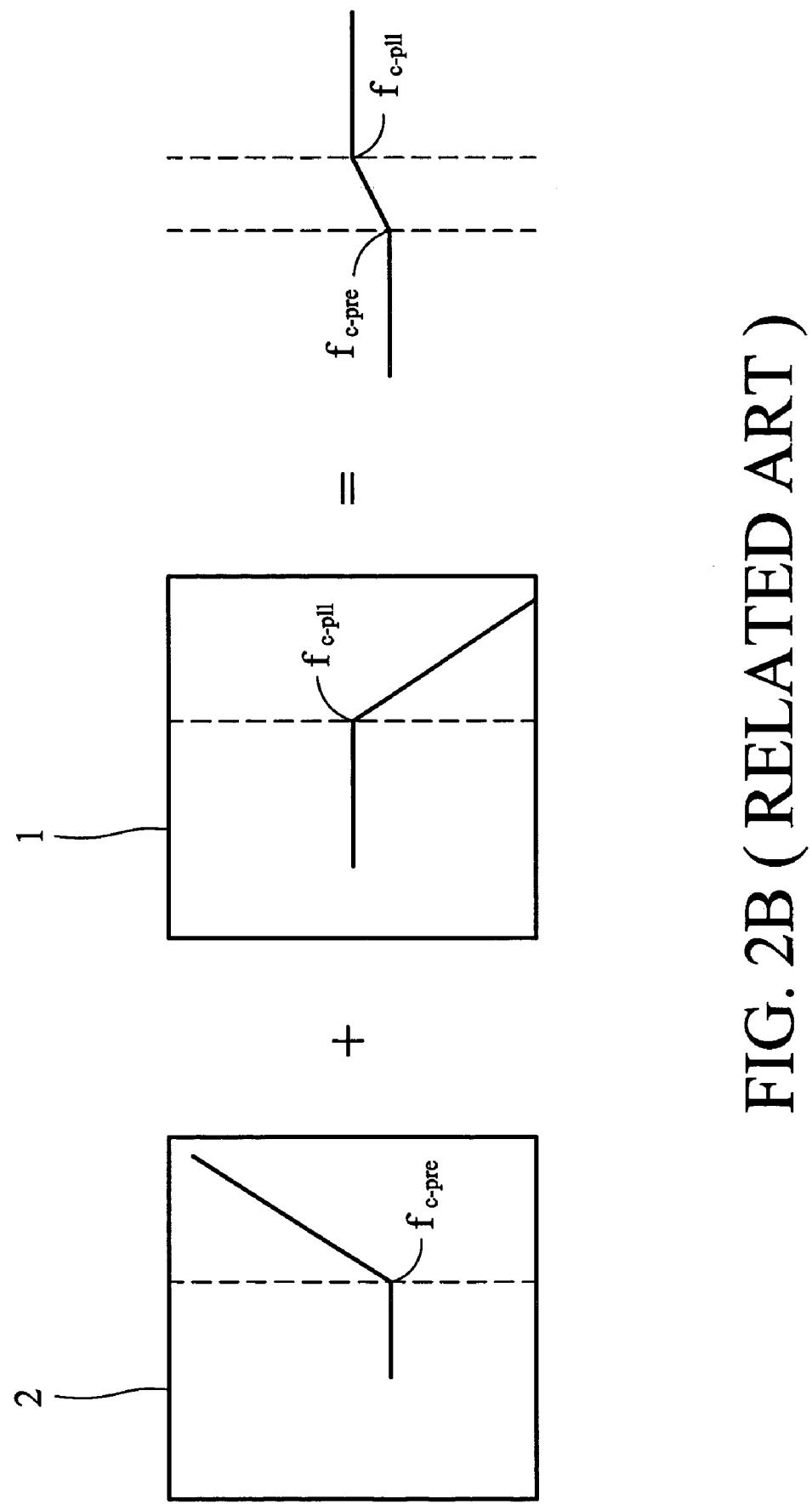
FIG. 2B shows bandwidth of a pre-emphasis filter narrower than the bandwidth of a synthesizer.
Figure 2C:
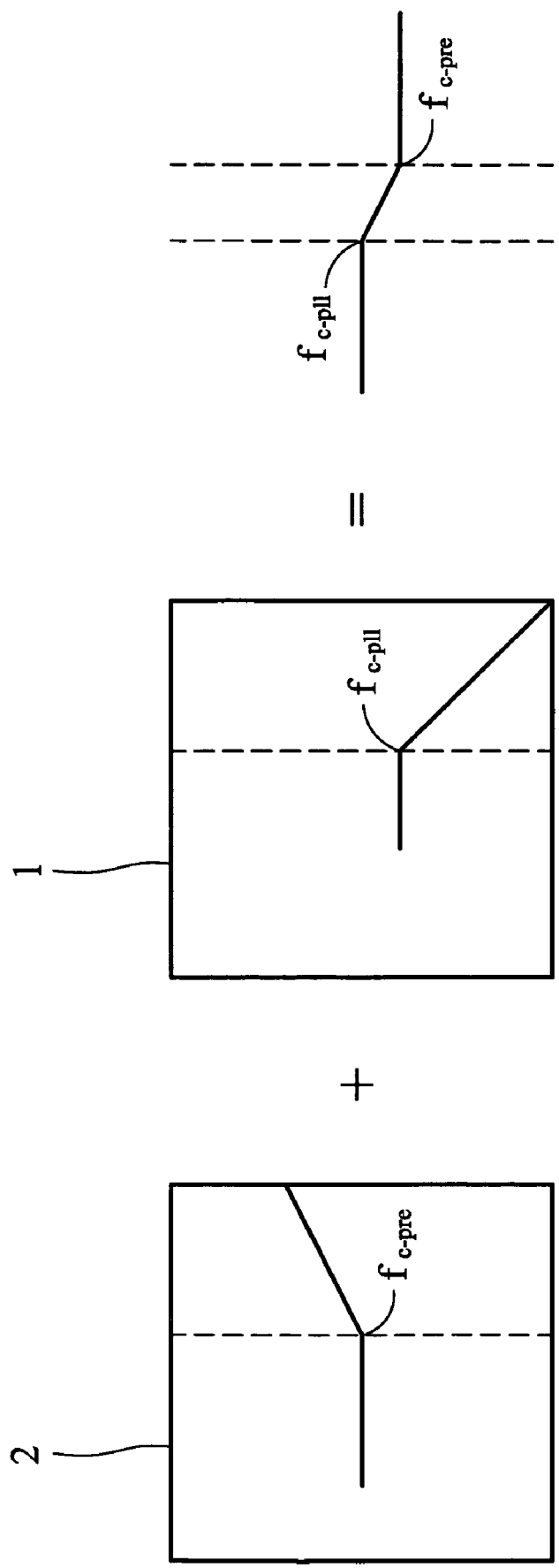
FIG. 2C shows bandwidth of a pre-emphasis filter wider than the bandwidth of a synthesizer.
Figure 3:
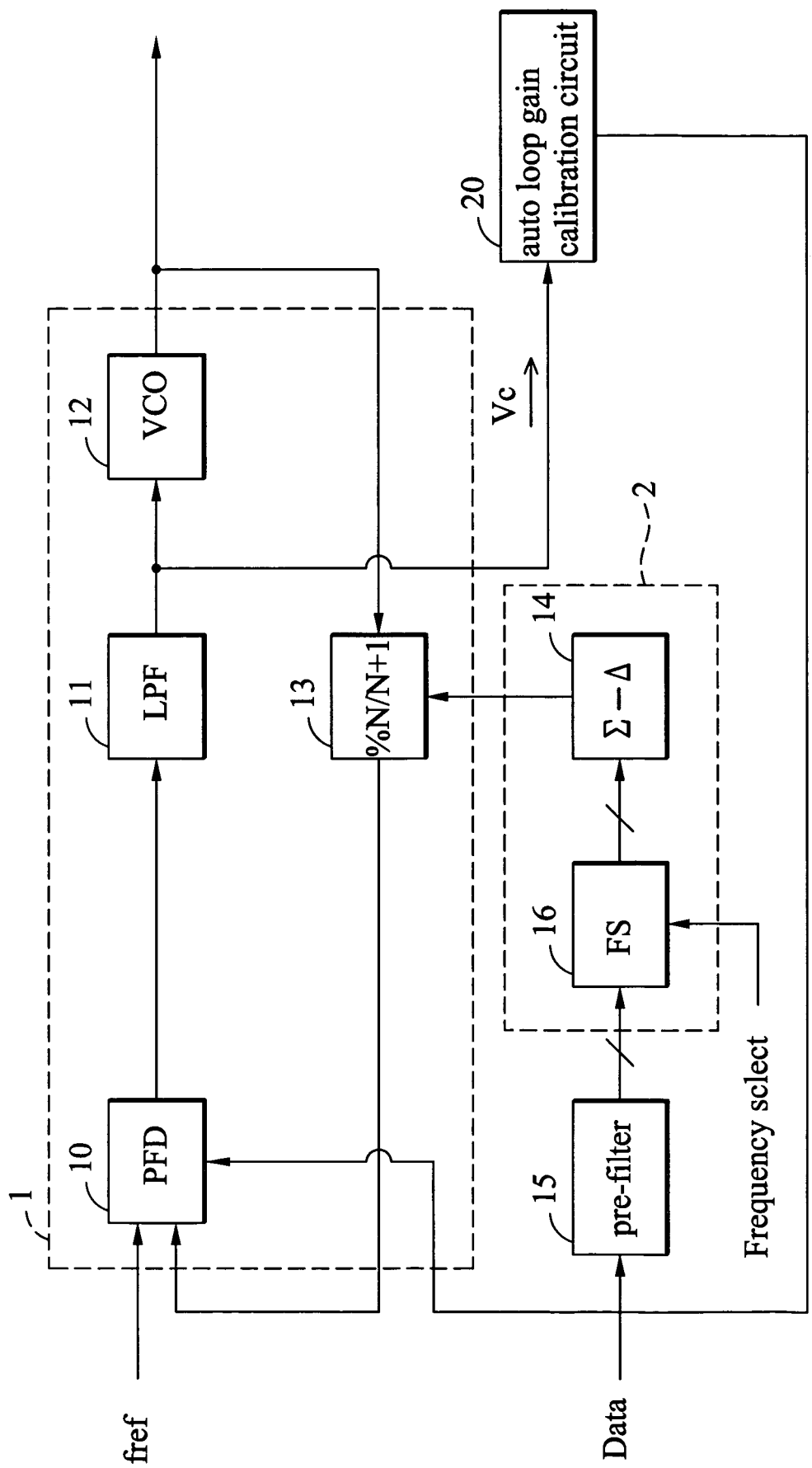
FIG. 3 is a block circuit diagram in accordance with an embodiment of the invention.

FIG. 3 is a block circuit diagram in according to an embodiment of the invention. A synthesizer comprises a phase frequency detector 10, a low pass filter 11, a voltage control oscillator 12, a frequency divider 13, a modulator 2 which comprises a Σ-Δ modulator 14 and a frequency selector 16, a pre-emphasis filter 15 and an auto loop gain calibration circuit 20.

A divided signal output from the frequency divider 13 and a reference clock signal fref are input to the phase frequency detector 10 for transforming a first signal with corresponding current.

The low pass filter 11 is coupled to the phase frequency detector 10 for filtering the high frequency portion of the first signal output from the phase frequency detector 10 and outputting a control signal.

The voltage control oscillator 12 coupled to the low pass filter 11 receives and transforms the control signal to a signal with a corresponding frequency (first frequency).

The frequency divider 13 controlled by the Σ-Δ modulator 14 is set in a feedback path for dividing the frequency applied from the voltage control oscillator 12 and outputting the divided signal to the phase frequency detector 10.

The pre-emphasis filter 15 receives an input signal such as, a set of digital modulated data, for example, for filtering and transmission to a carrier frequency from a frequency selector 16 to the Σ-Δ modulator 14.

The auto loop gain calibration circuit 20 is coupled to the output of the low pass filer circuit 11 for receiving the control signal Vc output from the low pass filter 11. When the frequency is locked by the phase locked loop circuit 1, a corresponding current gain is calculated by the auto loop gain calibration circuit 20 according to the voltage of the control signal Vc for compensating the gain of voltage control oscillator 12. The corresponding current gain is output to the phase frequency detector 10 for controlling the current of the output first signal, such that the frequency response of the pre-filter 15 matches the frequency response of phase locked loop circuit 1.

The phase locked loop circuit 1 in FIG. 3 is a closed loop circuit. The phase frequency detector 10, low pass filter 11, the voltage control oscillator 12, and frequency divider 13 form an open loop circuit. The equation (1) between the close loop and the open loop is given follows:

$$CL(S) = \frac{OL(S)}{1 + \frac{OL(S)}{N}}$$ equation (1)

Wherein function CL(S) represents the closed loop gain. OL(S) represents the open loop gain. N is the divisor of the divider 13.

In The equation (1), wherein $$OL(S) = \frac{K\Phi \cdot K_{VCO} \cdot Z(S)}{N \cdot S}$$ equation (2)

Wherein kφ is a gain of the phase frequency detector 10, kvco is a gain of the voltage control oscillator 12. Z(s) is the impedance of the low pass filter 11. In the embodiment, z(s) is controlled to be a constant value.

According to the equation (2), since impedance Z(s) is a constant, the factors which affect the mismatch are the current gain kφ, the gain kvco, and N.

As described above, because there is only one set of frequency response installed in a pre-emphasis filter 15, when a voltage control oscillator 12 is switched to a different frequency band, different gain of the voltage control oscillator 12 kvco is generated. Thus mismatch between pre-emphasis filter 15 and the phase locked loop occurs. The compensation method is to change the current gain kφ, as shown in the fallowing equation (3):

kφ,pre×kvco,pre/N,pre=kφ,p11×kvco,p11/N,p11     (3)

In practice, a voltage of a control signal of a low pass filter 11 is picked by the auto loop gain calibration 20, and then, according to the voltage value, a corresponding gain kvco, p11 of a voltage control oscillator 12 is determined by the auto loop gain calibration 20 after the frequency is locked. Then the current gain kφ,p11 of the phase frequency detector 10 is calculated by inserting values of a fixed current gain kφ,pre of pre-emphasis filter 15, and a fixed gain of voltage control oscillator 12 kvco,pre. The current of the phase frequency detector 10 is controlled by the calculated current gain kφ,p11.

Figure 4:
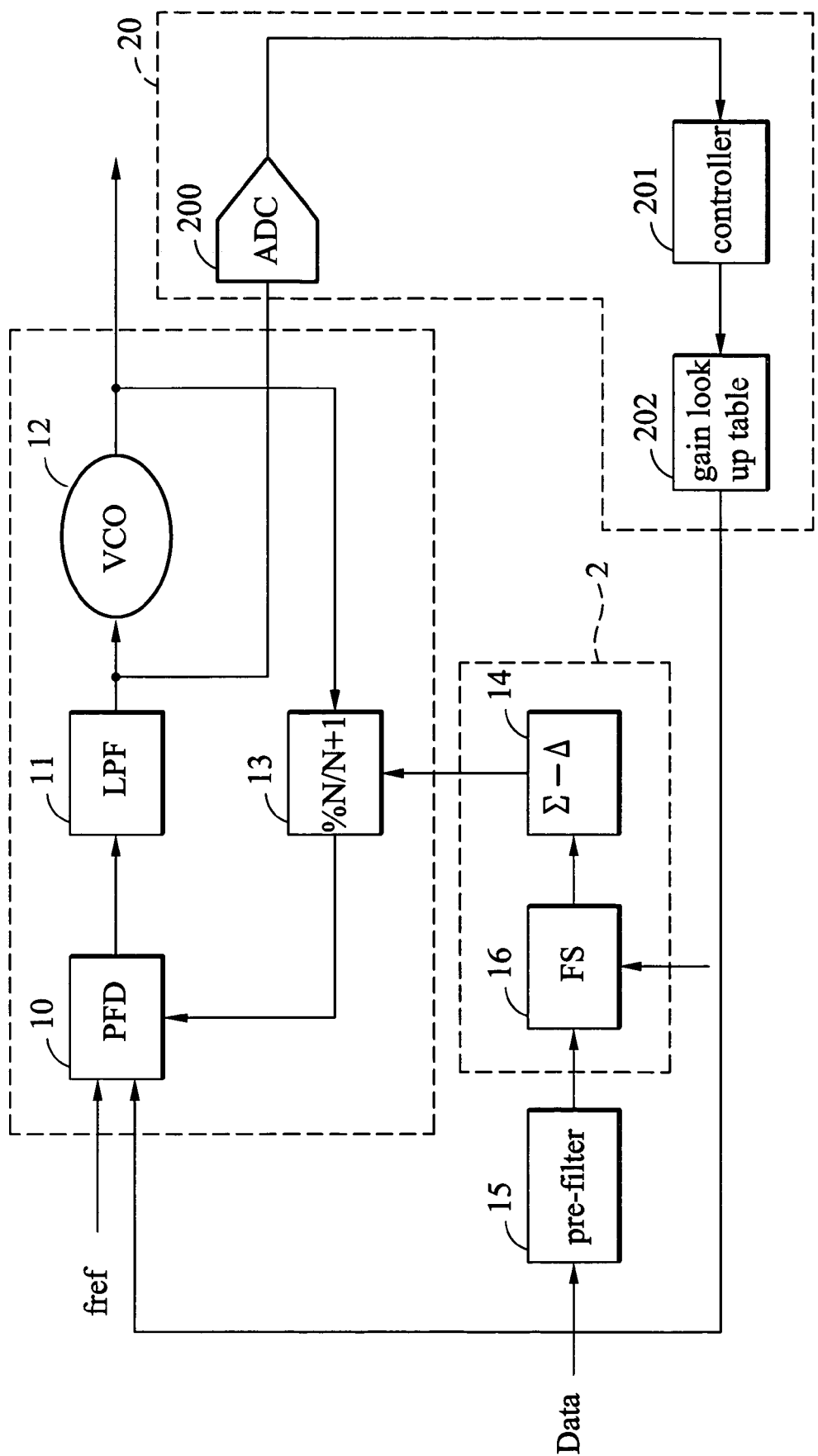
FIG. 4 shows a detailed circuit of the auto loop gain calibration circuit shown in FIG. 3.

FIG. 4 shows a detailed circuit of the auto loop gain calibration circuit 20 shown in FIG. 3. Other components such as phase frequency detector 10, low pass filter 11, and voltage control oscillator 12 etc in FIG. 4 are the same as FIG. 3, thus description thereof is omitted.

The auto loop gain calibration circuit 20 comprises an analog digital converter 200 (ADC), a controller 201 and a gain lookup table 202. The analog digital converter 200 converts the analog control signal to a corresponding digital signal. The controller 201 is coupled to the analog digital converter 200 for receiving the digital signal. After the digital signal is received, the controller 201 searches the gain lookup table 202 for the gain kvco, p11 of the voltage control oscillator 12 according to the digital signal. The current gain kφ, all of the phase frequency detector 10 is then calculated by inserting values of fixed current gain kφ,pre of pre-emphasis filter 15 a fixed gain of voltage control oscillator 12 kvco,pre and the found gain of the voltage control oscillator 12 kvco,p11.

Figure 5:
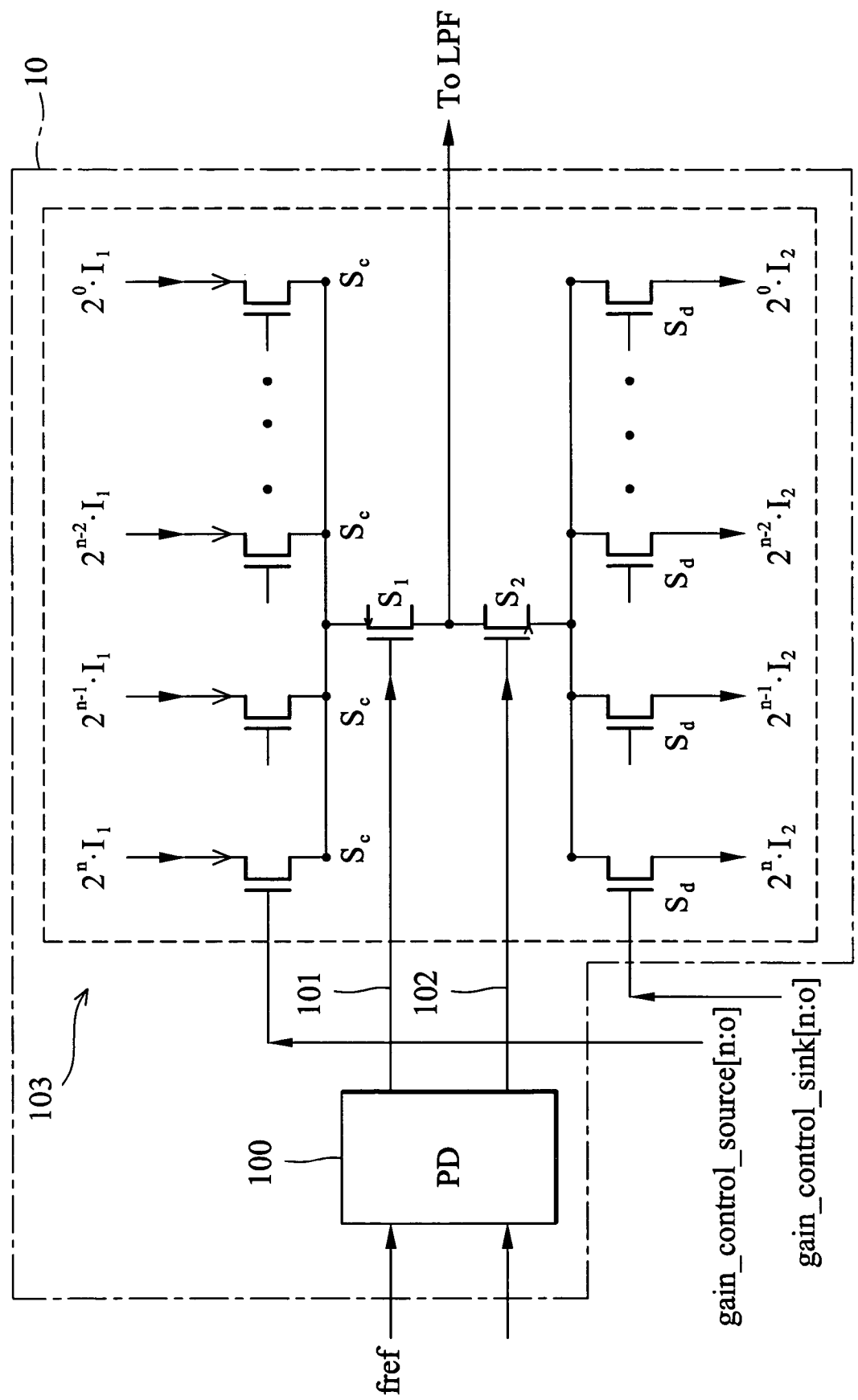
FIG. 5 shows a detailed circuit of the phase frequency detector shown in FIG. 3.

FIG. 5 shows a detailed circuit of the phase frequency detector 10 shown in FIG. 3. The phase frequency detector 10 includes a phase detector 100 and a charge pump 103. Wherein the reference clock signal fref and the divided signal is applied to the phase detector 100 for outputting an error signal from output terminals 101 or 102, to control switch S1 or switch S2, each of the switches $S_c$ or $S_d$ are coupled to the current sources $2^0I_1 \sim 2^nI_1$ or $2^0I_2 \sim 2^nI_2$, the switches $S_d$ are controlled by the n+1 bit digital signal gain_control_sink[n:0] to be in a on or off state. The switches Sc are controlled by the n+1 bit digital signal gain_control_source[n:0] to be in a on or off state.

In practice, an error signal is output from output terminal 101 or 102 to turn on switches S1 or S2, the current sum is determined by the number of the turned on switches $S_c$ or $S_d$. The determined current Is is output to the low pass filter 11.

Figure 6:
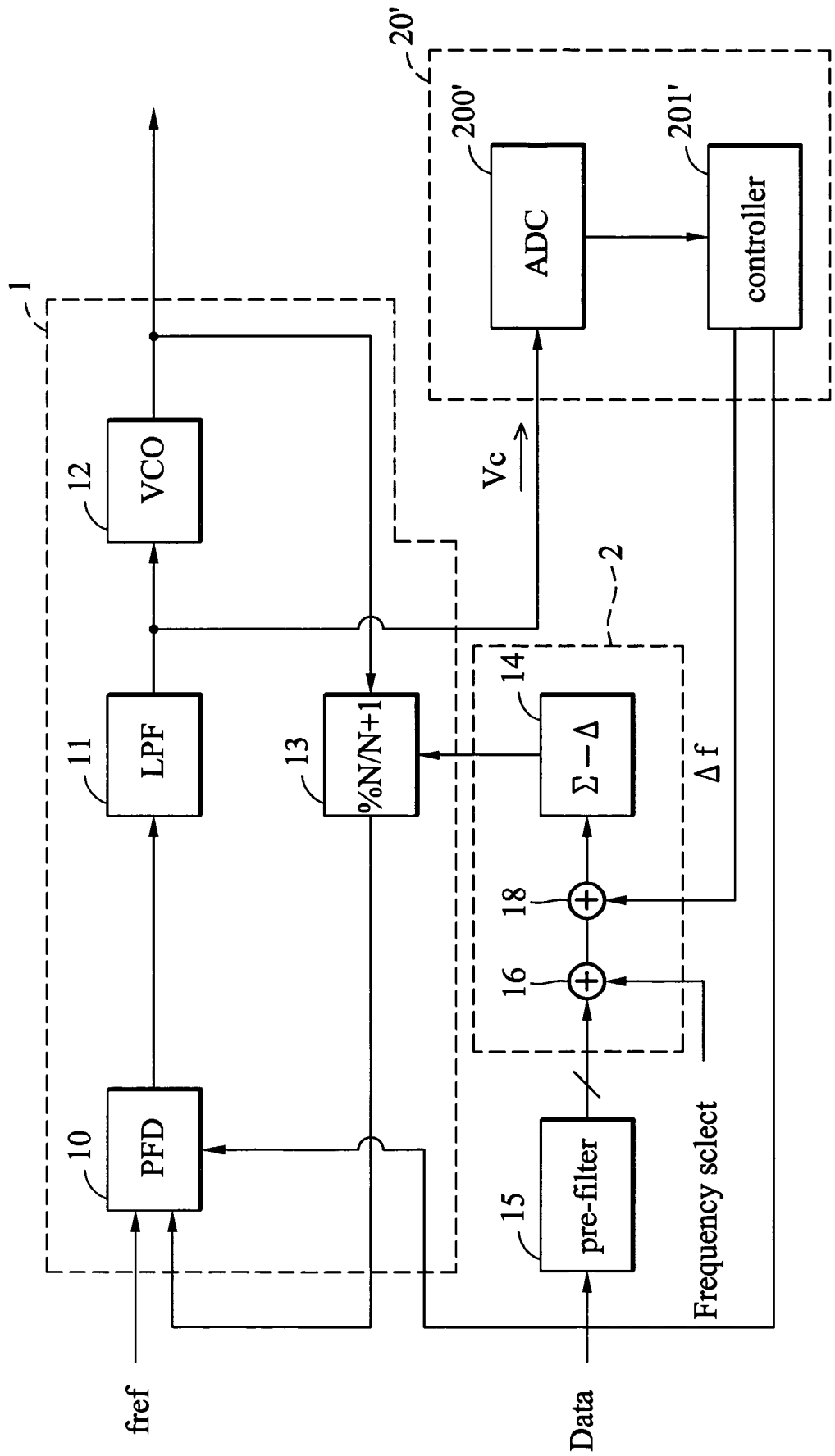
FIG. 6 shows another embodiment of the invention.

FIG. 6 shows another embodiment of the invention, wherein the elements are identical to the previous embodiment and further description is omitted herein. The main difference is that the auto loop gain calibration circuit 20' comprises an analog digital converter 200 and a controller 201', wherein an analog signal is input to the analog/digital converter 200 for converting to a digital signal. A first voltage is acquired by the controller 201' when a signal is locked by the phase loop locked circuit 1. Then, an offset frequency Δf is input to the adder 18 of the modulator 2 for modulating the input signal. Then a second voltage is acquired by the controller 201'. Finally, a corresponding current gain kφ, p11 is calculated by the offset frequency Δf and the difference between the second voltage and the first voltage $V_2-V_1$. The gain kvco of the voltage control oscillator 12 is then calculated by inserting values of offset frequency Δf and the difference between the second voltage and the first voltage $V_2-V_1$ to the following equation (4). The current gain kφ, p11 of the frequency phase detector 10 can then be calculated by inserting the equation (3).

$$k_{vco} = \frac{\Delta f}{V_2 - V_1} \quad \text{equation (4)}$$

Wherein Δf is the offset frequency, and $V_2-V_1$ is the difference between the second voltage and the first voltage $V_2-V_1$. When the offset voltage Δf and the voltage difference $V_2-V_1$ is very small, kvco=df/dv.

Figure 7:
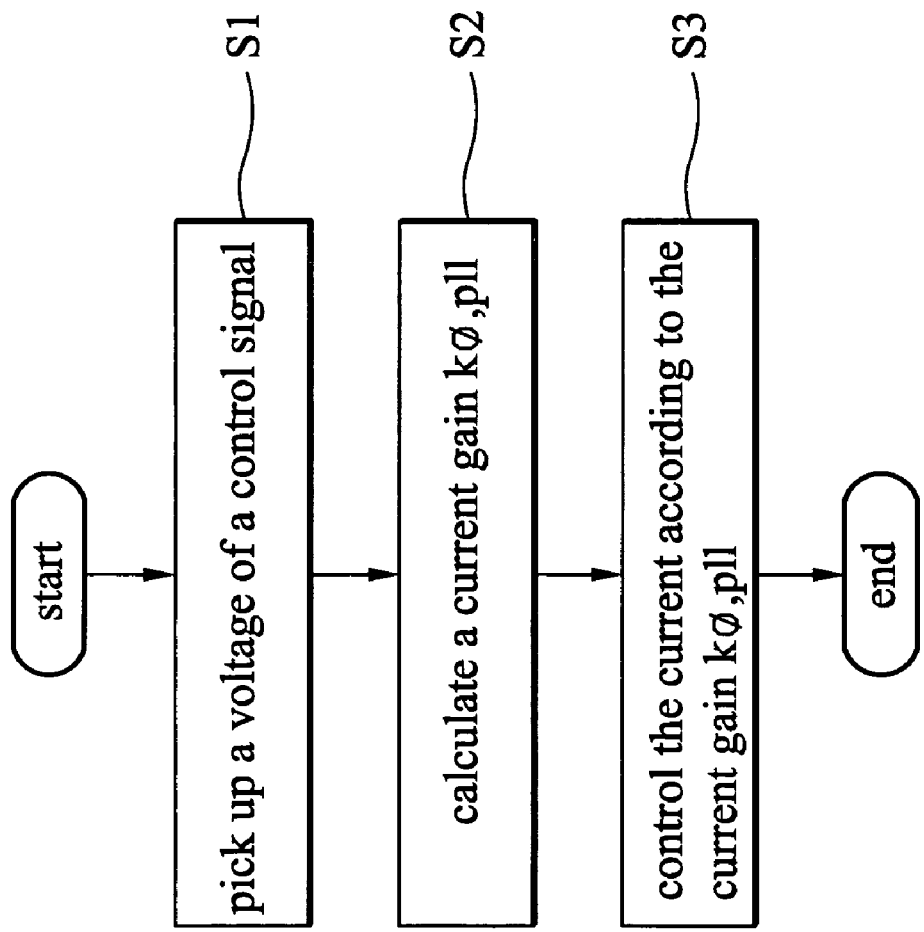
FIG. 7 shows a flow chart of an auto loop gain calibration method of the invention.

An auto loop gain calibration method of the invention is shown in FIG. 7, comprises the following steps:

In step $S_1$, a voltage value of a control signal is acquired by an auto loop gain calibration circuit, wherein the control signal is output from the low pass filter. In Step $S_2$, a current gain kφ, p11 corresponding to the control signal is calculated by the voltage value of the control signal. Finally, in step $S_3$, the current of the phase frequency detector is controlled by the controller according to the current gain. The corresponding current is output from the phase frequency detector for matching with the frequency of the pre filter matching the frequency of the frequency divider.

Figure 8:
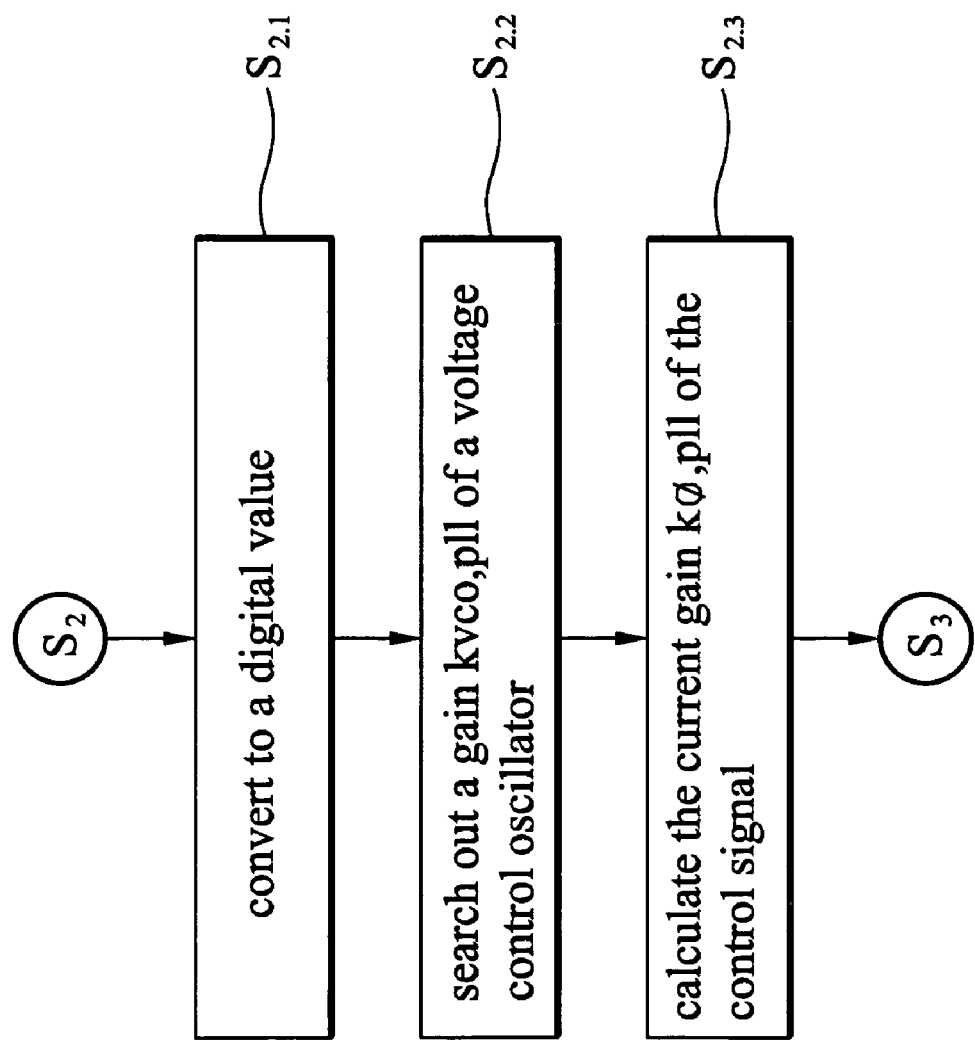
FIG. 8 shows a flow chart of the invention.

Step $S_2$ shown FIG. 8 further comprises the following steps.

In step $S_{2.1}$, a voltage value of the control signal is converted to a digital value by the analog/digital converter. In step $S_{2.2}$, a corresponding gain kvco, p11 of the voltage control oscillator is searched out in a gain lookup table by a controller. Finally, in $S_{2.3}$, the current gain kφ, p11 of the control signal is calculated by inserting values of fixed current gain kφ,pre of pre-emphasis filter 15, a fixed gain kvco,pre of voltage control oscillator 12 and the found gain kvco, p11 of the voltage control oscillator 12 into equation (3).

Figure 9:
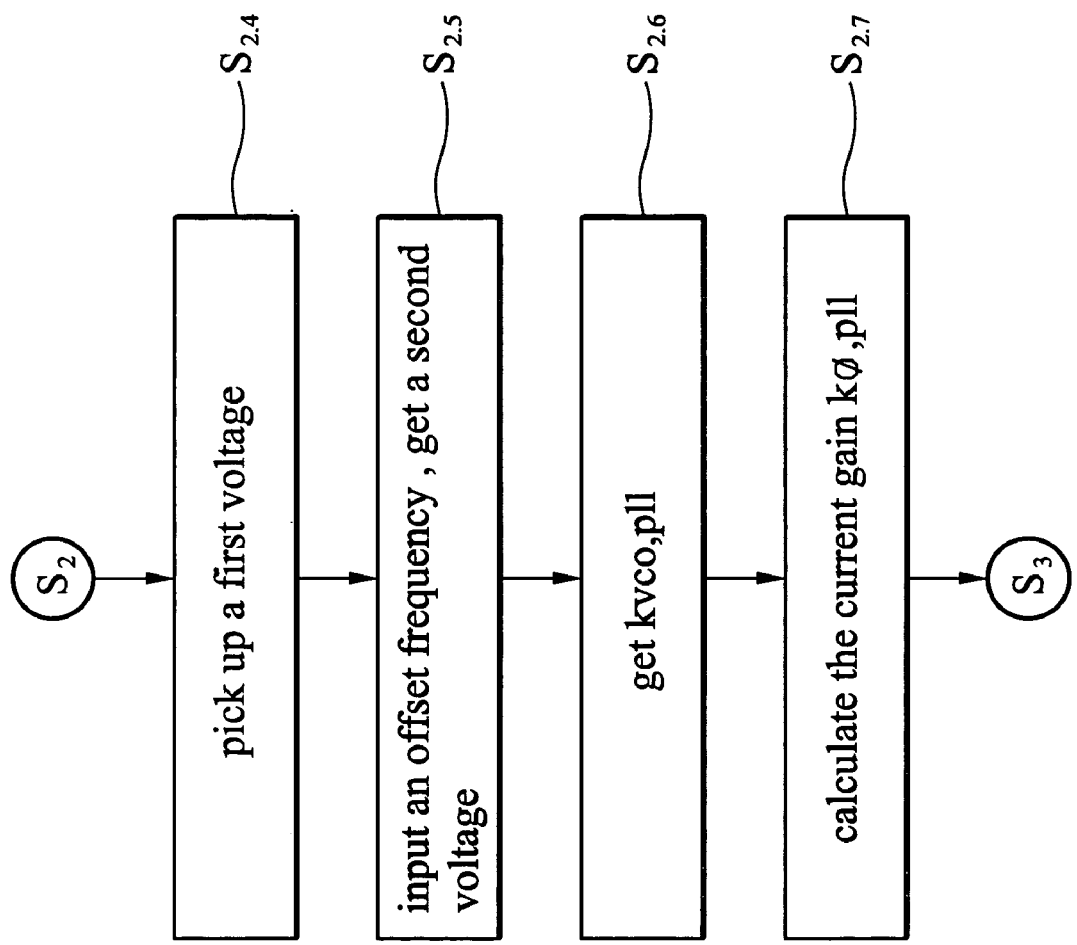
FIG. 9 shows a flow chart of the invention.

FIG. 9 shows another embodiment of the FIG. 7, which comprises the following steps.

First, in step $S_{2.4}$, a first voltage output from the low pass filter is acquired by the controller. Then, in step $S_{2.5}$, an offset frequency Δf is input, and a second voltage is then acquired from the low pass filter. In step $S_{2.6}$, a gain kvco, p11 of the voltage control oscillator is calculated by inserting values of offset frequency and the difference between the second voltage and the first voltage $V_2-V_1$. Finally, in step $S_{2.7}$, the current gain kφ, p11 of the control signal is calculated by inserting the values of fixed current gain kφ,pre of pre-emphasis filter 15, a fixed gain kvco,pre of voltage control oscillator 12 and the calculated gain kvco, p11 of the voltage control oscillator 12 into equation (3).

While the invention has been described by way of example and in terms of the preferred embodiments, it is to be understood that the invention is not limited to the disclosed embodiments. On the contrary, it is intended to cover various modifications and similar arrangements as would be apparent to those skilled in the art. Therefore, the scope of the appended claims should be accorded the broadest interpretation to encompass all such modifications and similar arrangements.

What is claimed is:

1. A frequency synthesizer used for modulating an input signal, comprising:
    a phase locked loop circuit, comprising a phase frequency detector for generating a first signal, a low pass filter for outputting a control signal derived from the received first signal, a voltage control oscillator, generating an output signal with a first frequency based on the control signal, a frequency divider, dividing the first frequency and for output to the input terminal of the phase frequency detector;
    a modulator, coupled to the frequency divider;
    a pre-emphasis filter, receiving and filtering the input signal for output to the modulator, wherein the frequency response of the phase locked loop circuit is substantially inverse to the frequency response of the pre-filter; and
    an auto loop gain calibration circuit, receiving the control signal, and calculating a current gain of the control signal in accordance with the voltage of the control signal, to compensate for the frequency response mismatch between the pre-emphasis filter and the frequency synthesizer.

2. The frequency synthesizer as claimed in claim 1, wherein the auto loop gain calibration circuit comprises:
    an analog/digital converter, for converting a received analog control signal to a corresponding digital signal;
    a gain value look up table, storing a gain value corresponding to the voltage control oscillator based on the digital signal;
    a controller, calculating the current gain of the control signal according to the gain of the voltage control oscillator and a fixed current gain and a fixed voltage gain for controlling the phase frequency detector.

3. The frequency synthesizer as claimed in claim 1, wherein a first voltage is acquired by the auto loop gain calibration circuit, a second voltage is subsequently acquired by the auto loop gain calibration circuit after an offset frequency is input into the modulator, a current gain of the control signal is calculated in accordance with the offset frequency, the difference between the second voltage and the first voltage, a fixed current gain and a voltage gain.

4. The frequency synthesizer as claimed in claim 1, wherein the phase frequency detector comprises:

a phase detector, receiving a reference clock signal and a divided signal for output of an error signal; and a charge pump, receiving the error signal for controlling a first switch or a second switch thereof.

5. The frequency synthesizer as claimed in claim 4, wherein the charge pump comprises:

the first switch, in an on or off state after receiving the error signal output from the phase detector, wherein the first switch receives a corresponding first current from a plurality of third switches, wherein each of the third switches is in an on or off state according to the output signal from the auto loop gain calibration circuit;

the second switch, in an on or off state after receiving the error signal output from the phase detector, wherein the second switch receives a corresponding second current from a plurality of fourth switches, wherein each of the fourth switches is in an on or off state according to the output signal from the auto loop gain calibration circuit.

6. The frequency synthesizer as claimed in claim 1, wherein the modulator comprises a $\Sigma\text{-}\Delta$ modulator and a channel selector, the channel selector is coupled to the pre-emphasis filter for output of the filtered signal to the $\Sigma\text{-}\Delta$ modulator and the channel selector.

7. A method, for auto calibrating a gain of a phase locked loop circuit of a frequency synthesizer, wherein the frequency synthesizer comprises a pre-emphasis filter and a low-pass filter, and the frequency response of the phase locked loop circuit is substantially inverse to the frequency response of the pre-emphasis filter; the method comprises the following steps:

generating a control signal output from a low pass filter to an auto loop calibration circuit;

converting the control signal to a corresponding digital signal;

locating a corresponding gain of the voltage control oscillator of the phase locked loop circuit according to the digital signal;

calculating the current gain of the control signal according to the gain of the voltage control oscillator, a fixed current gain and a voltage gain by the auto loop calibration circuit; and controlling a corresponding current according to the current gain, for matching the frequency of the pre-emphasis filter to the frequency divider.

8. The method as claimed in claim 7, wherein the control signal is input to the analog digital converter for conversion to a corresponding digital signal.

9. The method as claimed in claim 7, wherein a controller receives the digital signal, and then locates the gain of the voltage control oscillator in a look up table.

10. The method as claimed in claim 7, wherein the current gain of the phase frequency detector is calculated by a controller in accordance with a gain of the voltage control oscillator.

11. A method, for auto calibrating a gain of a phase locked loop circuit of a frequency synthesizer, wherein the frequency synthesizer comprises a pre-emphasis filter and a low-pass filter, and the frequency response of the phase locked loop circuit is substantially inverse to the frequency response of the pre-emphasis filter; the method comprises the following steps:

generating a control signal output from a low pass filter to an auto loop calibration circuit;

receiving a first voltage of the control signal output from the low pass filter;

inputting a offset frequency, and receiving a second voltage of the control signal output from the low pass filter;

calculating a gain of the voltage control oscillator according to the offset frequency, and the difference between the second voltage and the first voltage;

calculating the current gain of the control signal according to the gain of the voltage control oscillator and a fixed current gain; and controlling a corresponding current according to the current gain, for matching the frequency of the pre-emphasis filter to the frequency divider.

12. The method as claimed in claim 11, wherein the current gain of the control signal is calculated by a controller.

* * * * *